(12) United States Patent  
Blenkhorn

(10) Patent No.: US 8,286,342 B2
(45) Date of Patent: Oct. 16, 2012

(54) METHODS FOR MANUFACTURING ELECTRONIC DEVICES

(75) Inventor: Gary P. Blenkhorn, Cape Elizabeth, ME (US)

(73) Assignee: S.D. Warren Company, Boston, MA (US)

( * ) Notice: Subject to any disclaimer, the term of this patent is extended or adjusted under 35 U.S.C. 154(b) by 602 days.

(21) Appl. No.: 12/266,795

(22) Filed: Nov. 7, 2008

(65) Prior Publication Data

US 2009/0133909 A1 May 28, 2009

Related U.S. Application Data

(60) Provisional application No. 60/990,107, filed on Nov. 26, 2007.

(51) Int. Cl.
*H01R 9/00* (2006.01)
*H05K 3/00* (2006.01)
(52) U.S. Cl. ................. 29/842; 29/825; 29/846; 29/874
(58) Field of Classification Search ............ 29/842, 29/601, 825, 846, 874, 885; 101/153, 170, 101/401.1, 488, 491; 156/209, 219, 230, 156/247
See application file for complete search history.

(56) References Cited

U.S. PATENT DOCUMENTS

| | | |
|---|---|---|
| 2,463,370 A | 3/1949 | Flaster |
| 3,042,591 A | 7/1962 | Cado |
| 3,098,438 A | 7/1963 | Freund |
| 3,573,136 A | 3/1971 | Gardner |
| 3,682,738 A | 8/1972 | Smith |
| 3,814,647 A | 6/1974 | Scher et al. |
| 4,112,189 A | 9/1978 | Terwilliger |
| 4,138,945 A | 2/1979 | Rejto |
| 4,289,821 A | 9/1981 | Gray, III et al. |
| 4,322,450 A | 3/1982 | Gray et al. |
| 4,327,121 A | 4/1982 | Gray |
| 4,388,137 A | 6/1983 | McCarty et al. |
| 4,546,065 A | 10/1985 | Amendola et al. |
| 4,560,578 A | 12/1985 | Freeman |
| 4,740,258 A | 4/1988 | Breitscheidel |
| 5,116,548 A | 5/1992 | Mallik et al. |
| 5,460,921 A | 10/1995 | Cywar |
| 5,874,145 A | 2/1999 | Waller |
| 5,992,320 A * | 11/1999 | Kosaka et al. ............. 101/401.1 |
| 6,110,317 A | 8/2000 | Sandor |
| 6,207,003 B1 | 3/2001 | McClure et al. |
| 6,238,750 B1 | 5/2001 | Correll et al. |
| 6,272,275 B1 * | 8/2001 | Cortright et al. ............. 385/129 |

(Continued)

FOREIGN PATENT DOCUMENTS

DE 196 49 116 5/1998

(Continued)

OTHER PUBLICATIONS

BASF Handbook on Basics of Coating Technology, pp. 723-727, 2003.

*Primary Examiner* — Thiem Phan
(74) *Attorney, Agent, or Firm* — Fish & Richardson P.C.

(57) ABSTRACT

Methods are disclosed for manufacturing electronic devices (e.g., transistors, and etc.), solar arrays, optical display arrays, portions of such devices and arrays, and the like. Utilizing a scrape coating and/or a tip printing process, various electronic and solar arrays are manufactured.

23 Claims, 8 Drawing Sheets

U.S. PATENT DOCUMENTS

| | | |
|---|---|---|
| 6,355,343 B1 | 3/2002 | Glassock |
| 6,406,585 B1 | 6/2002 | Taubert |
| 6,635,202 B1 | 10/2003 | Bugg et al. |
| 6,861,024 B2 | 3/2005 | Glassock |
| 6,936,181 B2 | 8/2005 | Bulthaup et al. |
| 6,973,710 B2 | 12/2005 | Kiguchi et al. |
| 7,018,680 B2 | 3/2006 | Kasma et al. |
| 7,156,945 B2 | 1/2007 | Chaug et al. |
| 7,175,876 B2 | 2/2007 | Free et al. |
| 7,261,920 B2 | 8/2007 | Haubrich et al. |
| 7,393,081 B2 | 7/2008 | Maekawa et al. |
| 7,608,476 B2 | 10/2009 | Ramsdale et al. |
| 7,629,017 B2 | 12/2009 | Kodas et al. |
| 7,732,349 B2 | 6/2010 | Yamamoto |
| 2004/0028834 A1 | 2/2004 | Dove et al. |
| 2004/0142181 A1 | 7/2004 | Marsella et al. |
| 2005/0123678 A1 | 6/2005 | Maijala et al. |
| 2006/0130421 A1 | 6/2006 | Nollet et al. |
| 2006/0144004 A1 | 7/2006 | Nollet et al. |
| 2006/0172061 A1 | 8/2006 | Kohmura et al. |
| 2006/0237229 A1 | 10/2006 | Sugahara |
| 2008/0016686 A1 | 1/2008 | Lee |
| 2008/0153000 A1 | 6/2008 | Salot et al. |
| 2008/0248205 A1 | 10/2008 | Blanchet et al. |
| 2008/0268203 A1 | 10/2008 | Blenkhorn |
| 2009/0032493 A1 | 2/2009 | Chang |
| 2009/0133909 A1 | 5/2009 | Blenkhorn |

FOREIGN PATENT DOCUMENTS

| | | |
|---|---|---|
| DE | 102005006084 | 8/2006 |
| EP | 0 065 043 | 11/1982 |
| EP | 2 025 413 | 2/2009 |
| GB | 1 392 920 | 5/1975 |
| GB | 2 063 178 | 6/1981 |
| KR | 2003 0040695 | 5/2003 |
| WO | WO 90/15673 | 12/1990 |
| WO | WO 99/38680 | 8/1999 |
| WO | WO 99/61168 | 12/1999 |
| WO | 00/52975 | 9/2000 |
| WO | WO 03/074197 | 9/2003 |
| WO | WO 03/074198 | 9/2003 |
| WO | WO 03/076083 | 9/2003 |
| WO | WO 03/076716 | 9/2003 |
| WO | WO 03/077371 | 9/2003 |
| WO | 2010/002679 | 1/2010 |

* cited by examiner

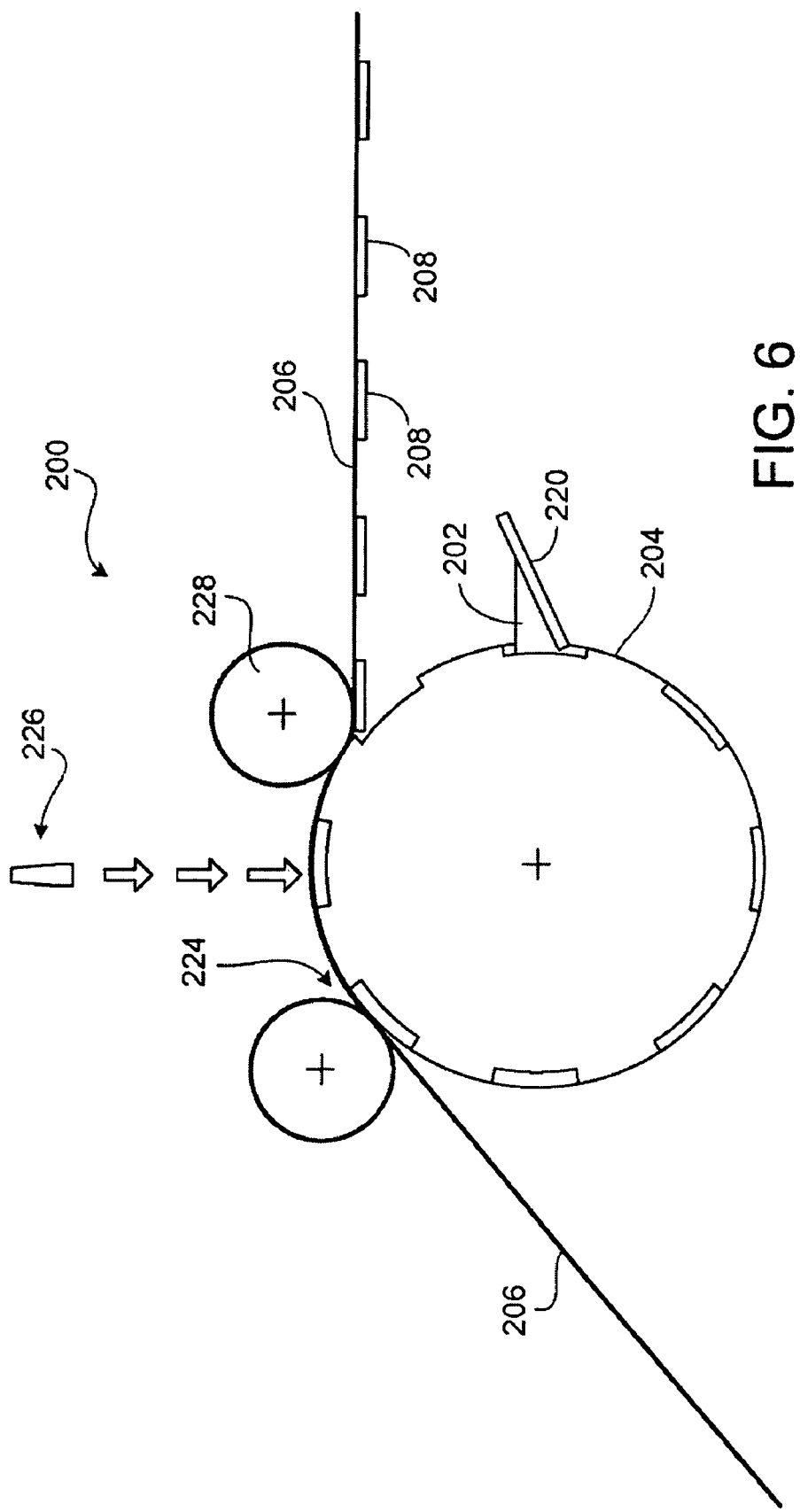

SOLAR COLLECTOR ARRAY

OPTICAL DISPLAY GRID ARRAY

PRINTED CIRCUIT

PRINTED TRANSISTOR

METHODS FOR MANUFACTURING ELECTRONIC DEVICES

PRIORITY INFORMATION

This patent application claims the benefit of U.S. Provisional Application Ser. No. 60/990,107, filed Nov. 26, 2007, the specification of which is hereby incorporated by reference.

TECHNICAL FIELD

This invention relates to tip printing and scrape coating of materials for use in electronic applications and methods of manufacturing electronic devices.

BACKGROUND

A printed circuit board (PCB) is a flat board that is adapted to hold and connect chips and other electronic components. The board is made of layers that interconnect components via copper pathways. PCBs typically connect mostly discrete components and electronic microcircuits (e.g., chips). Each chip contains from a few thousand up to hundreds of millions of transistors, which are manufactured through a semiconductor manufacturing process.

Generally, semiconductor device fabrication processes are used to manufacture transistors, the integrated circuits that are present in everyday electrical and electronic devices. The fabrication process is a multiple-step sequence of photographic and chemical processing steps during which electronic circuits are gradually formed on a substrate made of pure semiconducting material. Silicon is the most commonly used semiconductor material today, along with various compound semiconductors. In some cases, the entire manufacturing process from start to package-ready chips takes six to eight weeks and is performed in highly specialized and costly facilities referred to as fabrication plants (i.e., fabs).

In fab operations, the fixed overhead cost associated with producing chips is generally high. For example, even for simple designs, due to the depreciation of the fab and its equipment, the operation cost could be substantial. In addition, the manufacturing of PCBs requires an extensive initial cost and expensive equipment which can add to the overall cost of manufacturing electronic devices and systems.

Therefore, a need exists for an improved method and system for manufacturing electronic devices.

SUMMARY

The inventors have discovered new processes by which electrical devices (e.g., transistors, and other electronic components), solar arrays, optical display arrays and the like can be manufactured using a scrape coating or tip printing process.

In one aspect, the invention features a method of forming an electronic device comprising: (a) transferring a first curable material to a substrate using a pattern imparting medium to impart a pattern to the curable material; (b) configuring the pattern imparting medium so that the first curable material forms a plurality of substrate pre-forms on the substrate; and (c) forming a plurality of electrical circuits on the substrate by transferring a second hardenable material to the substrate pre-forms. The phrase "electronic device," as used herein, is intended to include both completed electronic devices and portions of devices, for example the drain portion of a printed-type semiconductor device or conductive connections in a circuit.

Some implementations include one or more of the following features. The pattern imparting medium carries a pattern on its surface and an inverse of the pattern is imparted on the first curable material. The method further comprises coating a portion of the pre-forms with conductive material. The method further comprises filling a recessed portion of the pre-forms with conductive material. The method further comprises curing the curable material. The first curable material and second hardenable material have different compositions. The first curable material is electrically non-conductive and the second hardenable material is electrically conductive. Coating comprises tip printing. Filling the recessed portion comprises scrape coating the pre-form. Tip printing comprises coating a raised area of the pre-form with an adhesive and then applying a conductive material to the adhesive. The pattern imparting medium is an-engraved roll, adapted to impart a pattern. The substrate is a continuous web of material.

In another aspect, the invention features a method of forming an electronic circuit. The method comprises (a) transferring a curable material to a substrate to form substrate pre-forms having raised areas and recessed areas; (b) curing the curable material; and (c) applying a conductive coating to at least a portion of the pre-forms in a configuration that defines at least a portion of the electronic circuit.

Some implementations include one or more of the following features. The method further includes applying a coating material, different from the conductive coating, to at least a portion of the pre-form. The method further includes placing an electronic device in communication with the printed circuit. The method further includes applying the coating material between the substrate pre-form and the conductive coating. The coating material may be an insulator. The conductive coating is applied to the raised areas using a tip printing process. Alternatively, the conductive coating is applied to the recessed areas using a scrape coating process. The substrate comprises a flat panel sheet and the circuit comprises an electrical array. The method further comprises placing a layer of material in the shape of a grid on top of the conductive coating.

In a further aspect, the invention features an electrical device comprising: (a) a substrate carrying a coating defining one or more substrate pre-forms, each pre-form having raised and recessed regions, the raised regions defining at least a portion of the electrical device; and (b) an electrically conductive coating material disposed only on the raised regions of the substrate pre-forms.

In yet another aspect, the invention features an electrical device comprising: (a) a substrate carrying a coating defining one or more substrate pre-forms, each pre-form having raised and recessed regions, the recessed regions defining at least a portion of the electrical device; and (b) an electrically conductive coating material disposed only in the recessed regions of the substrate pre-forms.

The invention also features, in another aspect, a method of forming an electronic circuit comprising: (a) depositing a first curable material on a substrate using a pattern imparting medium to generate substrate pre-forms, wherein the substrates pre-forms have recessed areas configured to define the shape of an electronic circuit; (b) curing the first curable material; and (c) applying a conductive ink to the pre-forms to fill the recesses thereby forming one or more electrical pathways.

In a further aspect, the invention features a method of forming a transistor comprising: (a) transferring a first curable material to a substrate using a pattern imparting medium to impart a pattern to the curable material; (b) configuring the pattern imparting medium so that the first curable material forms a substrate pre-form on the substrate; (c) tip printing a second layer on top of raised portions on the substrate; (d) filling a recessed portion of the pre-forms with conductive material; and (e) coating a third layer on the second layer, wherein the third layer covers portions of the second layer and the recessed portion.

In yet another aspect, the invention features a method of forming an electronic device comprising: (a) providing a substrate having a layer of first curable material that forms a plurality of substrate pre-forms on the substrate, the substrate pre-forms comprising a pattern of raised areas and recessed areas; and (b) forming a plurality of electrical circuits on the substrate by selectively transferring a second material only to predetermined portions of the substrate pre-forms.

The invention also features, in another aspect, method of forming electronic features comprising providing a pattern imparting medium comprising a surface having raised areas and recessed areas; scrape coating the surface to fill only the recessed areas with a coating material; hardening the coating material to form electronic features within the recesses; and removing the electronic features from the recessed areas.

In another aspect, the invention features a method of forming a conductive grid comprising: (a) providing a first substrate having a layer of first curable material that forms a plurality of substrate pre-forms on the substrate, the substrate pre-forms comprising a pattern of raised areas and recessed areas in the form of parallel rows; (b) forming a plurality of conductive lines on the first substrate by selectively transferring a conductive coating only to predetermined portions of the substrate pre-forms; (c) providing a second substrate having a layer of first curable material that forms a plurality of substrate pre-forms on the substrate, the substrate pre-forms comprising a pattern of raised areas and recessed areas in the form of parallel rows; (d) forming a plurality of conductive lines on the second substrate by selectively transferring a conductive coating only to predetermined portions of the substrate pre-forms; and (e) positioning the second substrate on top of the first substrate, with the parallel rows on the second substrate disposed substantially perpendicular to the parallel rows on the first substrate.

Some implementations include one or more of the following features. The first and second substrates are part of a single continuous web or sheet of material. The steps of forming parallel rows on the first and second substrates are performed concurrently on the same web or sheet of material. The method further includes separating the first substrate and second substrate from the sheet or web after forming the parallel rows. Alternatively, the two substrates may be formed separately, and may be of different materials and/or may be coated with different coatings. The method may further comprise disposing an insulative material between the first substrate and second substrate.

The details of one or more embodiments of the invention are set forth in the accompanying drawings and the description below. Other features and advantages of the invention will be apparent from the description and drawings, and from the claims.

DESCRIPTION OF DRAWINGS

FIG. 6 is a diagram showing another process for forming an electronic circuit in which a coating material is applied directly to an engraved roll.

Like reference symbols in the various drawings indicate like elements.

DETAILED DESCRIPTION

Embodiments of the present invention provide methods and systems that utilize tip printing and/or scrape coating processes to manufacture electronic devices, for example, components such as transistors, solar arrays, optical display arrays and the like. In some embodiments, substrate pre-forms that include a pattern of recessed areas and raised areas (protrusions) may be used as bases to receive one or more layers of material for electrical connection. The layers of material may be applied to the recessed areas by scrape coating and/or to the raised areas by tip printing. Utilizing a scrape coating process, a roll is used to flood coat the recessed areas with a coating material. The substrate preform is then scraped, removing the coating material from areas other than the recessed areas. Utilizing a tip printing process, a coating material is applied only to the upper surface of the protrusions. The materials used in scrape coating and/or tip printing can have conductive, semiconductive or non-conductive properties. In some embodiments of the present invention, a combination of scrape coating and tip printing processes, which utilize conductive, non-conductive or semiconductive materials, is used to manufacture electronic devices.

In other implementations, a pattern imparting medium, for example an engraved roll or patterned web, acts as an array of substrate pre-forms, to which a coating material can be applied by tip printing or scrape coating directly onto the patterns imparting medium. The coating material can then be applied to a substrate and hardened, and the hardened coating material and substrate can be stripped from the pattern imparting medium.

In this way, an electronic device can be manufactured by utilizing tip printing and/or scrape coating processes. These processes will be discussed in detail below.

The methods and systems described herein may be used to tip print and scrape coat a wide variety of substrates, such as flexible webs, sheet materials, glass substrates, fiberglass substrates, metallic sheets, plastic sheets and the like.

Forming Substrate Pre-Forms

In some implementations, a substrate pre-form is formed by a method that includes coating a curable liquid onto a substrate, imparting a pattern to the coating using a pattern imparting surface, curing the coating, and stripping the substrate and the cured coating from the pattern-imparting surface. In some implementations, the entire process is conducted on a continuous web of material which is drawn through a series of processing stations (e.g., as shown diagrammatically in FIG. 1).

Figure 1:
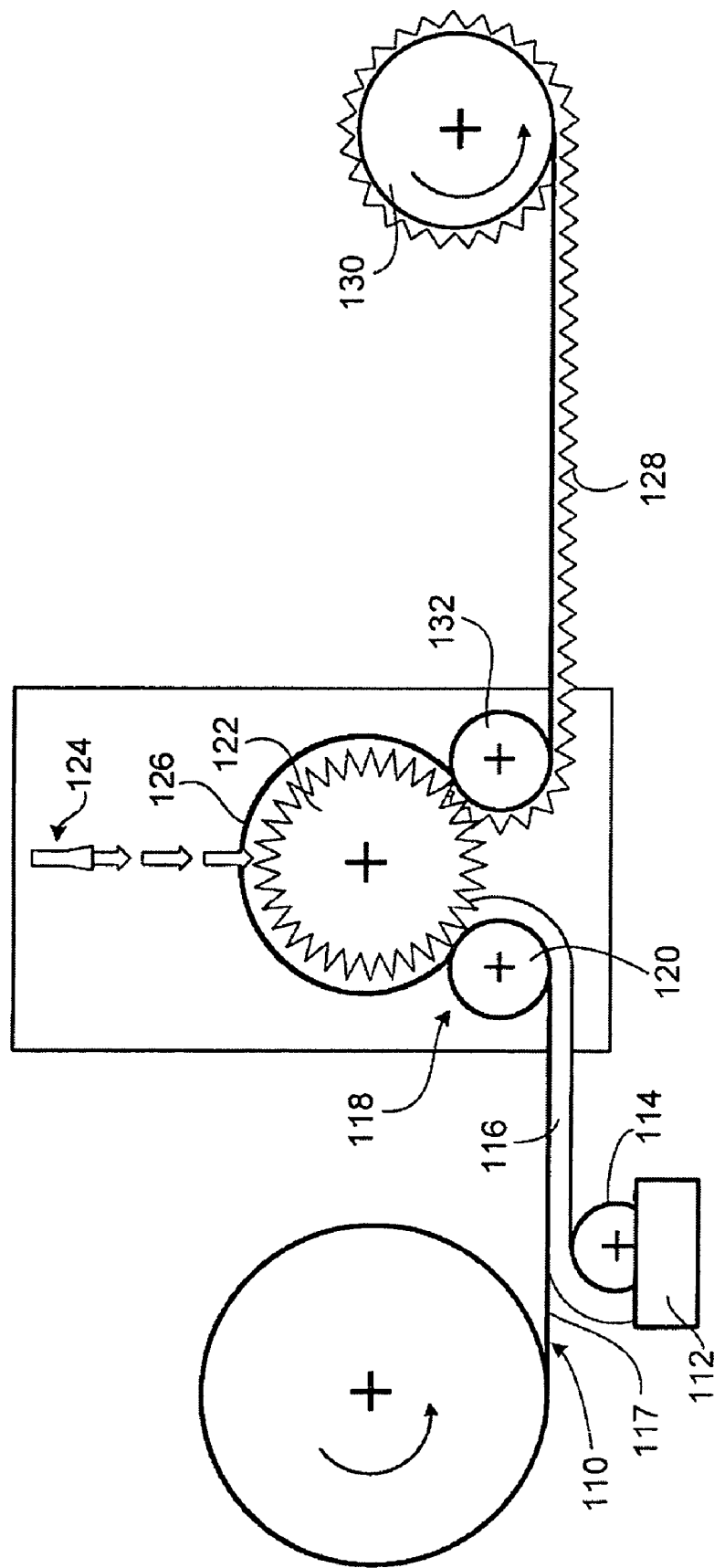
FIG. 1 is a diagram showing a process for forming substrate pre-forms.

Referring to FIG. 1, in one process a web 110 (e.g., a polymeric film), first passes through a coating station 112 where a coating head 114 applies a wet coating 116 to a surface 117 of the web. Next, the coated web passes through a nip 118 between a backing roll 120 and an engraved roll 122, with the wet coating 116 facing the engraved roll 122. The engraved roll carries a pattern on its surface, the inverse of which is imparted to the wet coating. Nip pressure is generally relatively low (e.g., "kiss" pressure), with the nip pressure being selected based on the viscosity of the coating to prevent the coating from being squeezed off of the web, while still allowing the engraved texture to be imparted to the coating.

After leaving the nip, the coated and patterned web passes through a curing station 124 (e.g., an electron beam (e-beam) or UV curing device or a heating device). The coating is cured while it is still in contact with the surface of the engraved roll. E-beam energy or actinic radiation is generally applied from the back surface 126 of the web and passes through the web and cures the coating 116 to form a hardened, textured coating 128 that is firmly adhered to the web 110. At this point, the web 110 and cured coating 128 may be subjected to one of the further processing steps discussed below, to add a coating layer (e.g., conductive or non-conductive or semiconductive layers) to the substrate surface areas. Alternatively, the web 110 and cured coating 128 may be stripped off the engraved roll at take-off roll 132 and wound up on a take up roll 130. If UV curing is used, the web should be transparent or translucent to UV radiation if curing is to be performed from the back surface of the web as shown.

The coating 116 may be applied using any suitable method. Suitable techniques include offset gravure, direct gravure, knife over roll, curtain coating, spraying, and other printing and coating techniques. The coating can be applied directly to the web, before the substrate contacts the roll, as shown in FIG. 1, or alternatively the coating can be applied directly to the roll, in which case the substrate is pressed against the coated roll.

The coating may be cured by thermal curing, electron beam radiation, or UV radiation. Electron beam radiation is preferred in some cases because it can penetrate the thick coatings required for certain desired patterns. Electron beam radiation units are readily available and typically consist of a transformer capable of stepping up line voltage and an electron accelerator. Manufacturers of electron beam radiation units include Energy Sciences, Inc. and PCT Engineered Systems, LLC, Davenport, Iowa. Suitable UV curing devices are commonly available (e.g., from Fusion, Inc., Gaithersburg, Md.). In some embodiments, the coating material may harden without the use of a curing station after it is patterned.

The engraved roll discussed previously is one example of a replicative surface disposed on a rotating endless surface such as a roll, drum, or other cylindrical surface that may be used to impart the pattern to the wet coating. Other types of pattern-imparting devices, including flat replicative surfaces and textured webs, can also be used as a mold to cast a substrate pre-form. Application Ser. No. 11/742,257, filed on Apr. 4, 2007, the disclosure of which is incorporated herein by reference, provides such methods to manufacture substrate pre-forms.

Figure 2:
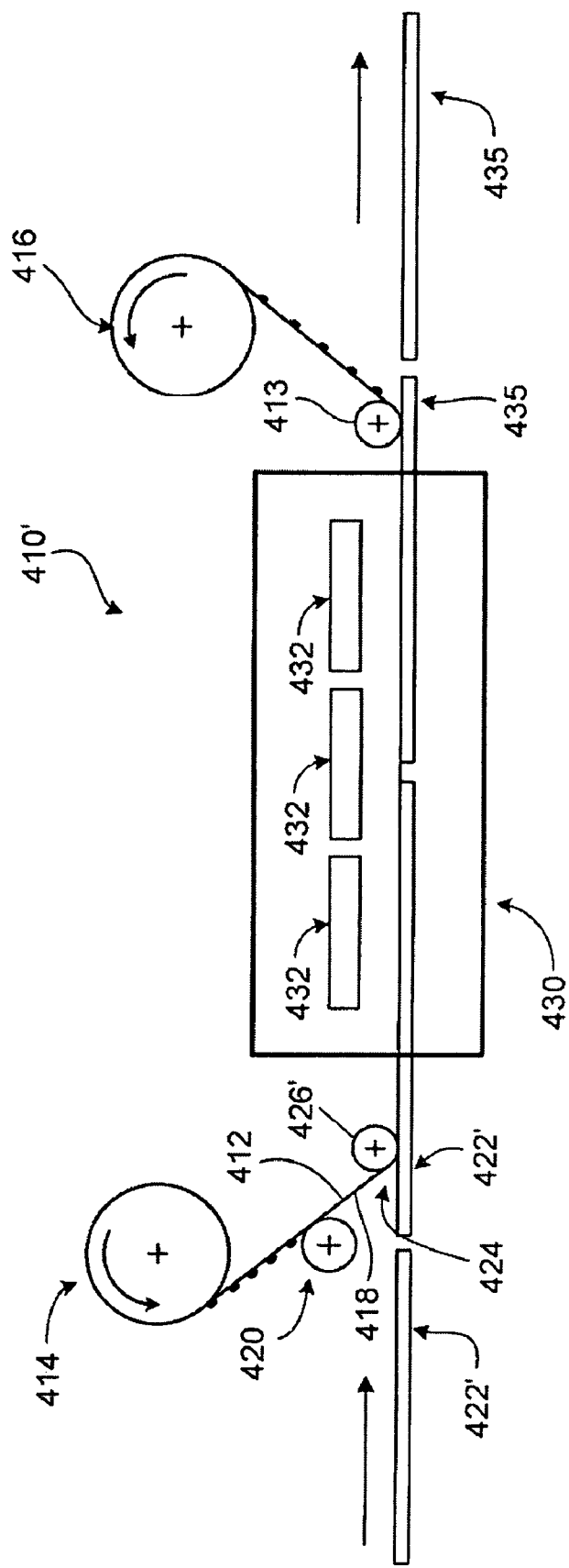
FIG. 2 is a diagram showing another process for forming substrate pre-forms.

For example, as shown in FIG. 2, instead of an engraved roll, a textured web may be used to impart a pattern on substrate pre-forms. Referring to FIG. 2, a machine 410' for manufacturing a substrate pre-form includes a textured web 412 that is delivered from a supply roll 414 and wound up on a take up roll 416. The textured web 412 provides the replicative surface 418 against which the substrate is nipped. A curable coating is applied to surface 418 at a coating station 420. The textured web and curable coating are selected so that the curable coating, when cured, will release from the textured web.

The substrate 422', shown in FIG. 2 as a series of discrete circuit boards or other generally rigid electronic substrates, enters the machine at nip 424, where it is nipped against roll 426'. The circuit boards are supported by a conveyor or series of rollers (not shown). The roll 426' presses the coated surface of the textured web 412 against the facing surface of the substrate 422'. The thus-formed sandwiches then travel through a curing station 430 which includes radiation delivery devices 432, e.g., UV lamps or electron beam delivery devices. The radiation delivery devices are mounted above the sandwiches, and the texturing medium is above the substrate 422', so that the coating can be cured through the texturing medium while the boards are supported by the underlying conveyor or rollers.

After curing, the textured web 412 is stripped off of the substrate carrying the cured coating by passing the textured web 412 around a stripping roll 413. The cured, textured coating remains on substrate 422' defining the finished substrate pre-form 435. In the implementation shown in FIG. 2, the weight of the boards holds the boards against the conveyor or rollers during stripping. In other implementations, other types of stripping techniques may be employed. The textured web 412 is wound up on the take up roll 416 and may be re-used multiple times (e.g., more than 50 times or 70 times or more).

Since curing is done from the textured web side, the substrate can be any desired material, for example cellulosic, ceramic, metal or textile materials, of any desired thickness. As a result, a wide variety of substrate pre-forms can be manufactured using the process.

The replicative surfaces discussed above may have various patterns consistent with the shapes and layouts of desired electronic circuits, printed circuits, electrical arrays, such as solar collector arrays or optical display grid arrays, and the like.

Coating and substrate materials will be discussed below in the "Materials" section.

Applying Coating Materials to the Substrate Pre-Forms

Figure 3:
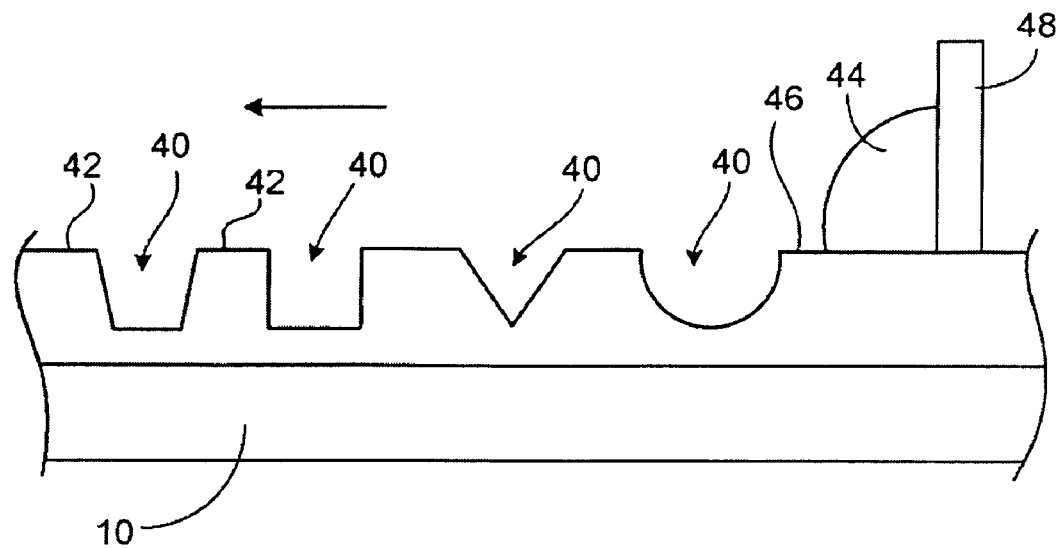
FIGS. 3 and 3A are diagrams showing a process for forming electronic circuits from the substrate pre-forms formed in the process shown in FIG. 1.

After the substrate pre-forms are formed using one of the processes shown in FIG. 1 or FIG. 2 and described above, a coating material (e.g., a conductive ink) is applied to the substrate pre-forms to form a layer. (The word "layer" as used herein, is intended to include discontinuous layers, such as are formed by tip printing unconnected raised areas of the substrate pre-forms.) The conductive ink may be applied, for example, using either of the processes shown in FIGS. 3-3A and FIGS. 4-4A. The process shown in FIGS. 3-3A, referred to as "scrape coating," is suitable for use when the pattern applied by the engraved roll during the process of FIG. 3 is the positive of the desired electrical device shape (i.e., the pattern on the engraved roll is the positive or "pattern up"). Conversely, the process shown in FIGS. 4-4A, referred to as "tip printing," is suitable when the pattern applied to the web is the negative of the desired electrical device shape.

Figure 3A:
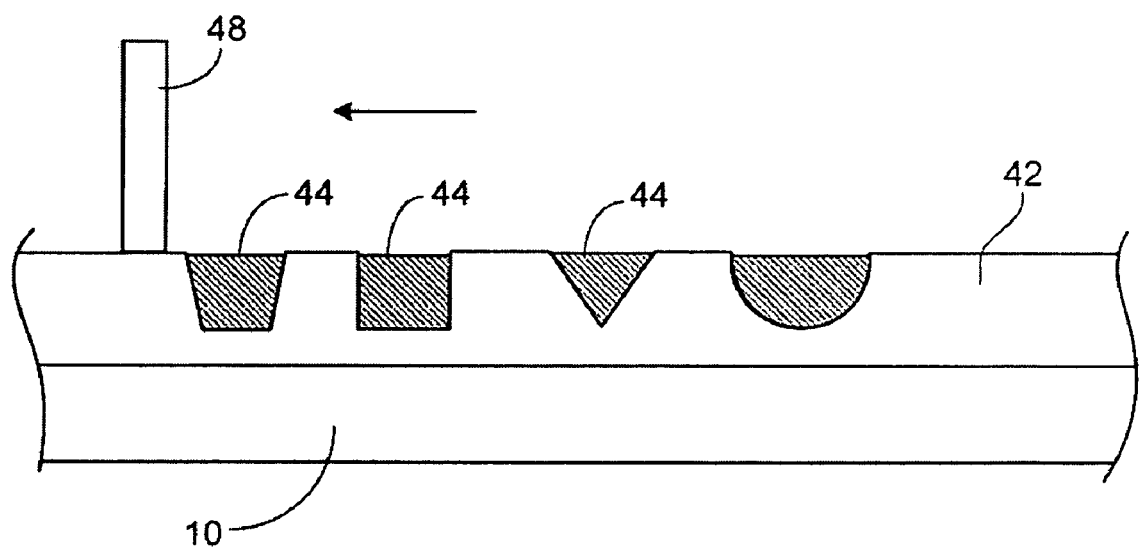

Referring to FIGS. 3-3A, in the scrape coating process, the coating material is applied to the substrate pre-form so as to fill a recess (or recesses) 40 in the cured coating 42 on web 10. Using a scraping device 48, a conductive ink 44 or other coating material is applied to the top surface 46 of the cured coating 42, and scraped across the top surface 46 (FIG. 3A) to fill in the recess 40, forming the finished pattern, which corresponds to an electrical device or a portion of an electrical device. After scrape coating, the top surface 46 is substantially free of the coating material.

Figure 4:
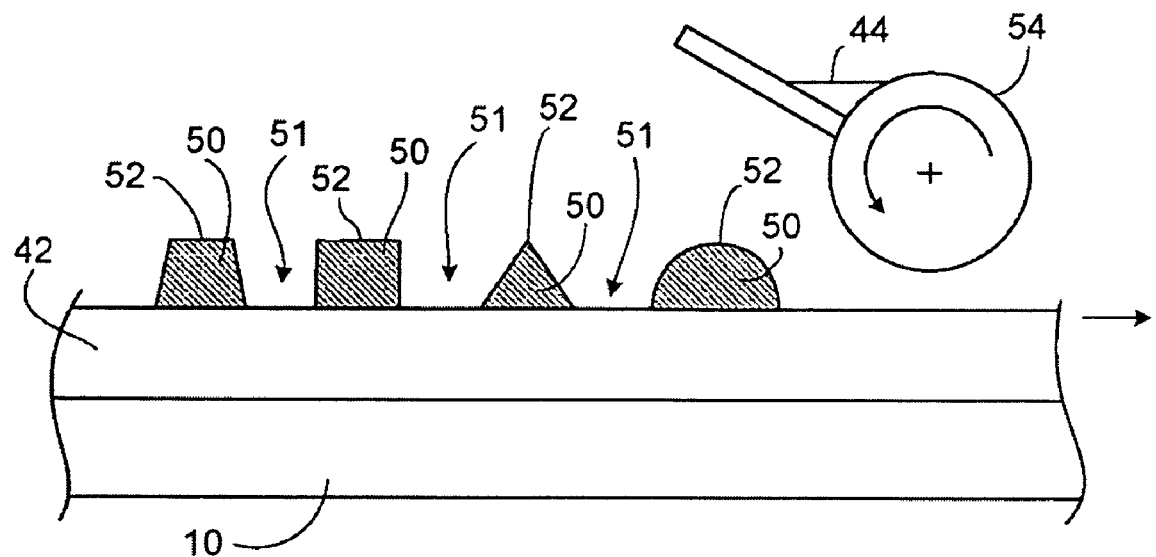
FIGS. 4 and 4A are diagrams showing an alternative process for forming electronic circuits from the substrate pre-forms formed in the process shown in FIG. 1.
Figure 4A:
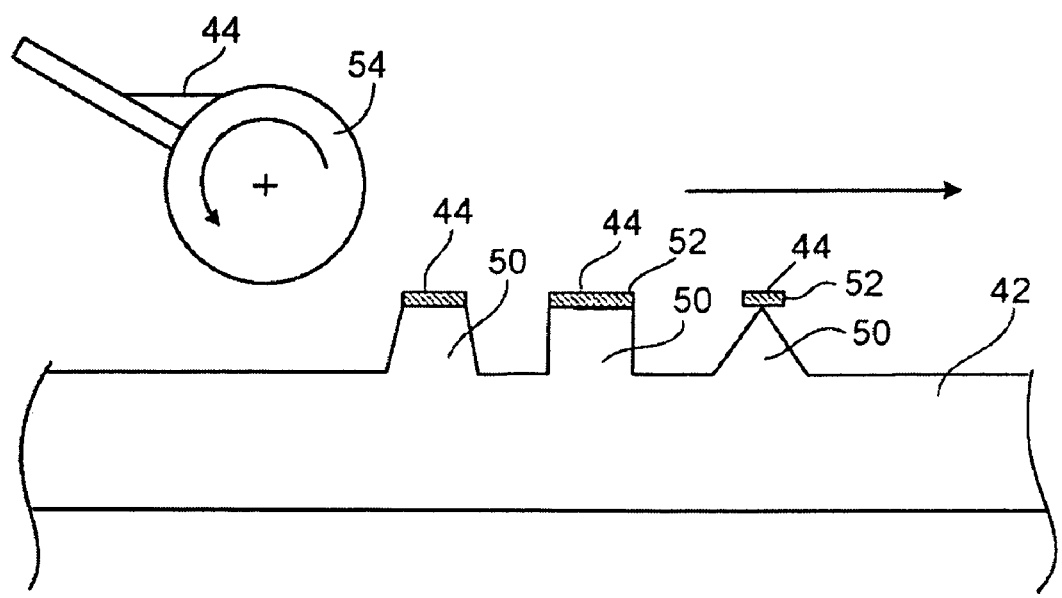

Referring to FIGS. 4-4A, in the tip printing process, the coating material is applied to the substrate pre-form so as to coat only a protrusion (or protrusions) 50 defined by the raised areas of the cured coating 42. In this case, the conductive ink 44 or other coating material is applied to the upper surface 52 of protrusion 50 (e.g., using a rotating printing roll 54) as shown. Alternatively, an adhesive may be applied to the upper surface 52, and conductive particles or a conductive foil applied to the adhesive. After tip printing, the areas 51 remain substantially free of the conductive ink or other coating material.

As shown in FIGS. 3-3A and FIGS. 4-4A, shaped recesses and protrusions may have various patterns consistent with the shapes and layout of the desired circuit. Depending on the application, the recessed areas or protrusions may include patterns of various shapes and forms.

Figure 7:
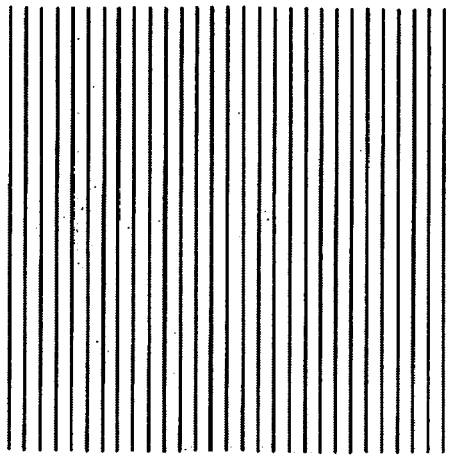
FIG. 7 is a diagrammatic view of a solar collector array, according to one implementation.

For example, in some implementations, as shown in FIG. 7, the patterns may be in the form of parallel rows (e.g., parallel ridges and valleys), which are then tip printed or scrape coated with conductive material to define parallel lines of conductive material, for example to define a solar collector array.

Figure 8:
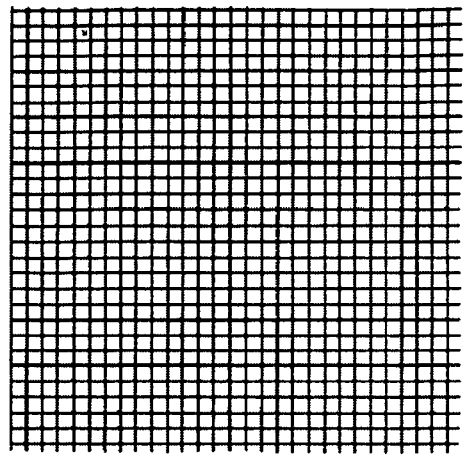
FIG. 8 is a diagrammatic view of an optical display grid array, according to one implementation.

If it is desired that the finished product be in the form of an optical display grid array as shown in FIG. 8, two sheets of material having the parallel conductive lines shown in FIG. 7 can be placed one on top of the other, and one sheet can be rotated approximately 90 degrees with respect to the other, so that the lines of one sheet are generally perpendicular to the lines of the other sheet. The substrate that lies between the two sets of lines can act as an insulator, or a separate insulator can be interposed between the two substrates to further prevent shorting. If desired, the two sheets can be made in a single process, e.g., by forming the parallel lines of conductive material on a single continuous web of material that can then be sheeted and the sheets arranged as described above.

Figure 9:
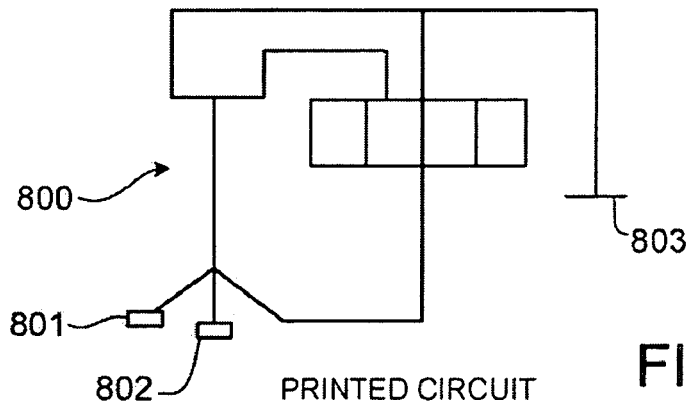
FIG. 9 is a diagrammatic view of a printed circuit, according to one implementation.

In other implementations, as shown in FIG. 9, patterns may be in the form of printed circuit electrical connections adapted for future use with electrical components (e.g., microchips and the like). For example, a microchip can be placed in electrical communication with a printed circuit 800 at input/output ports 801, 802, and 803.

Figure 5:
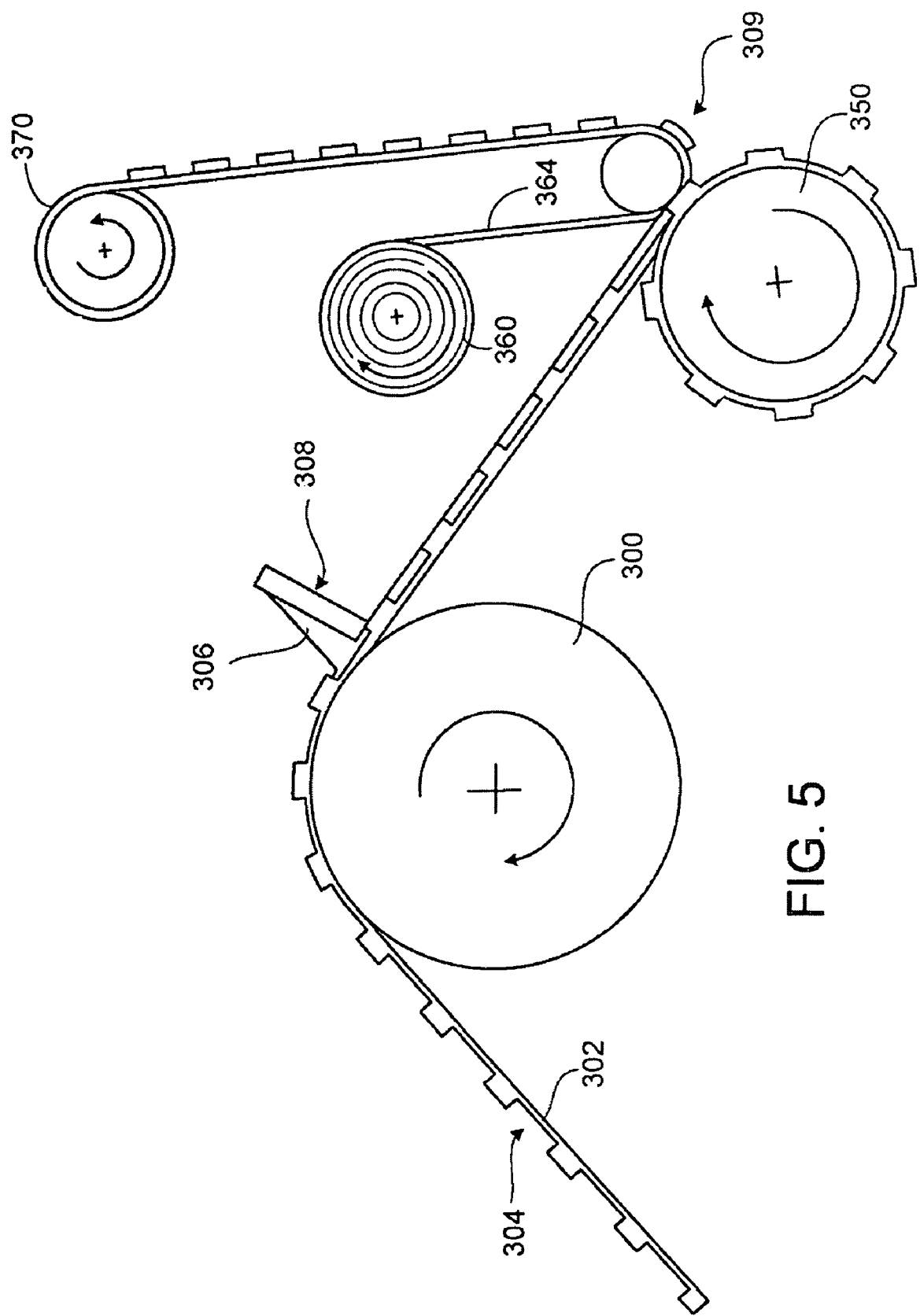
FIG. 5 is a diagram showing a process for forming electronic components from the substrate pre-forms formed in the process shown in FIG. 1.

Referring to FIG. 5, in alternative processes a web 302 carrying recessed substrate pre-forms 304 passes under the surface of the backing roll 300 of a knife over roll coater, and is flood coated with a conductive ink 306 at a coating station 308 which fills the pre-forms with conductive ink. A blanket roll 360 engages with web 302 after the web recesses are flood coated with the conductive ink 306. Each coated unit 309 is removed from the web 302 and transferred to web 364, as a take up roll 370 winds up the web 364 containing each coated unit 309. In some cases, after each coated unit 309 has been removed from the web 302 and transferred to web 364, a tip printing process (not shown) is used to apply a coating on an upper surface of coated unit 309.

Depending on the application, the ink and/or the coating used in these processes may have a resistivity ranging from $1.0 \times 10^{-9}$ ohm-meters to about $1.0 \times 10^{15}$ ohm-meters, and in some applications, the resistivity of the ink and/or the coating used in the tip printing process may be equal to or greater than $1.0 \times 10^{11}$ ohm-meters. In other embodiments, instead of a conductive ink, other coating materials, such as polish materials, films and the like may be used.

Figure 10:
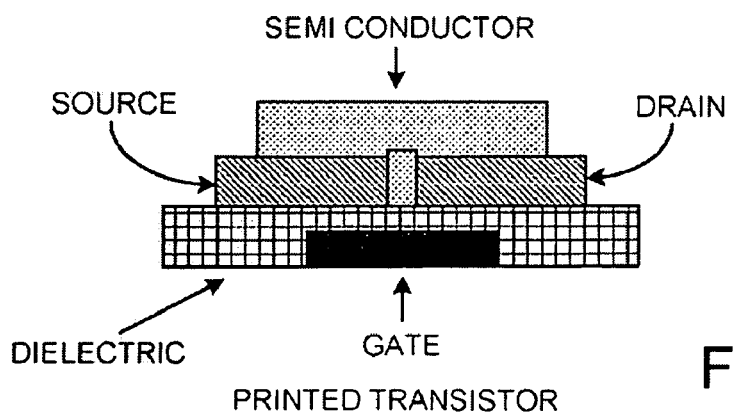
FIG. 10 is a diagrammatic view of a semiconductor device, according to one implementation.

Utilizing scrape coating and/or tip printing as described above, an electronic semiconductor device may be manufactured on a substrate. For example, as shown in FIG. 10, a transistor 900 may be manufactured through a combination of one or more scrape coating and/or tip printing processes.

Forming Electrical Features using a Patterning Medium as a Pre-Form

Figure 6A:
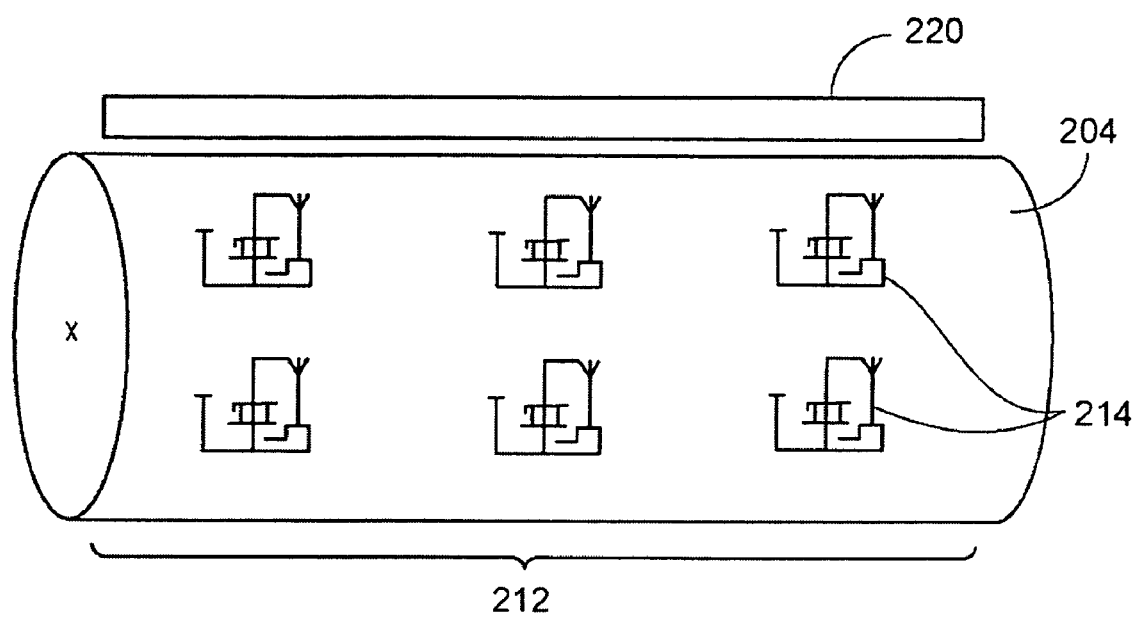
FIG. 6A is a diagrammatic front view of the engraved roll shown in FIG. 6 and coaters for applying coatings to the engraved roll.

Referring to FIG. 6, in another implementation, the electrical features (e.g., layers) are formed on a web at a single processing station 200, using a patterning medium (in FIG. 6, an engraved roll) as the pre-form onto which a coating material is scrape coated. In this process, pre-forms are not formed on the web, but instead, the electrical features are formed directly on the patterning medium and then placed on the web 206.

A curable conductive coating 202 is applied at an area of an engraved roll 204, and is then transferred to the web 206 to form the electrical feature 208. For example, referring to FIG. 6A, the engraved roll may include area 212, engraved with patterns of printed circuits 214. A coater 220 delivers the conductive coating 202 to the area 212. Referring again to FIG. 6, the coatings are then transferred to the web 206 at nip 224, cured by an e-beam or UV curing device 226, and the coated web is stripped from the engraved roll at take-off roll 228.

Depending on the application, the engraved roll may include feature patterns that may be in various shapes and forms. If desired, a different patterning medium may be used, e.g., a web carrying a pattern of pre-forms, rather than an engraved roll.

Materials

The substrate web may be any desired material, such as a board or glass to which the curable coating will adhere (e.g., a paper or film). Polymeric films to which the coating would not normally adhere can be treated, e.g., by flame treatment, corona discharge, or pre-coating with an adhesion promoter. Suitable substrates include paper, polyester films, films of cellulose triacetate, biaxially oriented polystyrene and acrylics.

If electron beam or UV curing will be used, the non-conductive coatings referred to above preferably include an acrylated oligomer, a monofunctional monomer, and a multifunctional monomer for crosslinking. If ultraviolet radiation is used to cure the acrylic functional coating, the coating will also include a photoinitiator as is well-known in the art. The conductive coatings may use these ingredients as a binder, to which a silver filler or other highly electrically conductive filler is added.

Preferred acrylated oligomers include acrylated urethanes, epoxies, polyesters, acrylics and silicones. The oligomer contributes substantially to the final properties of the coating. Practitioners skilled in the art are aware of how to select the appropriate oligomer(s) to achieve the desired final properties. Desired final properties for the release sheet of the invention typically require an oligomer which provides flexibility and durability. A wide range of acrylated oligomers are commercially available from Cytec Surface Specialties Corporation, such as Ebecryl 6700, 4827, 3200, 1701, and 80, and Sartomer Company, Inc., such as CN-120, CN-999 and CN-2920.

Typical monofunctional monomers include acrylic acid, N-vinylpyrrolidone, (ethoxyethoxy) ethyl acrylate, or isodecyl acrylate. Preferably the monofunctional monomer is isodecyl acrylate. The monofunctional monomer acts as a diluent, i.e., lowers the viscosity of the coating and increases flexibility of the coating. Examples of monofunctional monomers include SR-395 and SR-440, available from Sartomer Company, Inc., and Ebecryl 111 and ODA-N (octyl/decyl acrylate), available front Cytec Surface Specialties Corporation.

Commonly used multifunctional monomers for crosslinking purposes are trimethylolpropane triacrylate (TMPTA), propoxylated glyceryl triacrylate (PGTA), tripropylene glycol diacrylate (TPGDA), and dipropylene glycol diacrylate (DPGDA). Preferably, the multifunctional monomer is selected from a group consisting of TMPTA, TPGDA, and mixtures thereof. The preferred multifunctional monomer acts as a crosslinker and provides the cured layer with solvent resistance. Examples of multifunctional monomers include SR-9020, SR-351, SR-9003 and SR-9209, manufactured by Sartomer-Company, Inc., and TMPTA-N, OTA-480 and DPGDA, manufactured by Cytec Surface Specialties Corporation.

Preferably, the coating comprises, before curing, 20-50% of the acrylated oligomer, 15-35% of the monofunctional monomer, and 20-50% of the multifunctional monomer. The formulation of the coating will depend on the final targeted viscosity and the desired physical properties of the cured coating. In some implementations, the preferred viscosity is 0.2 to 5 Pascal seconds, more preferably, 0.3 to 1 Pascal seconds, measured at room temperature (21-24° C.).

The coating composition may also include other ingredients, such as opacifying agents, colorants, slip/spread agents and anti-static or anti-abrasive additives. The opacity of the coating may be varied, for example, by the addition of various pigments, such as titanium dioxide, barium sulfate and calcium carbonate, by the addition of hollow or solid glass beads, or by the addition of an incompatible liquid such as water. The degree of opacity can be adjusted by varying the amount of the additive used.

As mentioned above, a photoinitiator or photoinitiator package may be included if the coating is to be UV cured. A suitable photoinitiator is available from the Sartomer Company under the tradename KTO-46™. The photoinitiator may be included at a level of, for example, 0.5-2%.

The conductive coating or other coating material may be any coating that can be tip printed or scrape coated (depending on the process to be used) and that is suitable for forming the desired electrical circuit or component. The coating material may be conductive, semi-conductive or non-conductive, and may be hardenable by any desired method, including curing, firing and solvent evaporation.

Other Embodiments

A number of embodiments of the invention have been described. Nevertheless, it will be understood that various modifications may be made without departing from the spirit and scope of the invention.

While certain shapes have been shown and discussed herein, any desired shape of an electrical pattern may be used, for example: circular, oval, diamond-shaped, etc.

Additionally, a combination of multiple scrape coating and/or tip printing processes can be used, where different material layers, tip printed and/or scrape coated, may have various resistivities in order to form a transistor or a portion of a transistor on a substrate pre-form. For example, in some embodiments, one layer may be covered by an insulator (e.g., an insulative layer), and the insulative layer may be covered by another conductive or semiconductive layer. Furthermore, different conductive layers, which are separated by an insulative layer, can be connected through another process, (e.g., a pressing step), where one area of a first layer is connected to another area of a second layer. In this way, tip printing and/or scrape coating can be used to form portions of various semiconducting devices (e.g., portions of transistors) that are placed in electronic components which are then positioned in electrical communication with other devices.

Accordingly, other embodiments are within the scope of the following claims.

What is claimed is:

1. A method of forming an electronic device comprising:
   (a) transferring a first curable material to a substrate using a textured web that is delivered from a supply roll and wound up on a take up roll and that imparts a pattern to the curable material, a layer of the first curable material forming a plurality of substrate pre-forms on the substrate, the substrate pre-forms comprising a pattern of raised areas and recessed areas; and
   (b) forming a plurality of electrical circuits on the substrate by selectively transferring a second material only to predetermined portions of the substrate pre-forms.

2. The method of claim 1 further comprising curing the curable material by delivering curing energy from curing devices positioned adjacent the substrate such that the curing energy passes through the textured web before reaching the curable material.

3. The method of claim 1 wherein the substrate is a cellulosic substrate.

4. The method of claim 1 wherein the substrate is in the form of a metal plate.

5. A method of forming an electronic device comprising:
   (a) transferring a first curable material to a substrate using a textured web that is delivered from a supply roll and wound up on a take up roll and that imparts a pattern to the curable material;
   (b) configuring the pattern imparting medium so that the first curable material forms a plurality of substrate pre-forms on the substrate; and
   (c) forming a plurality of electrical circuits on the substrate by transferring a second hardenable material to the substrate pre-forms.

6. The method of claim 5 wherein the textured web carries a pattern on its surface and an inverse of the pattern is imparted on the first curable material.

7. The method of claim 5 further comprising coating a portion of the pre-forms with conductive material.

8. The method of claim 7 wherein coating comprises tip printing.

9. The method of claim 5 further comprising filling a recessed portion of the pre-forms with conductive material.

10. The method of claim 9 wherein filling the recessed portion comprises scrape coating the pre-form.

11. The method of claim 5 further comprising curing the curable material.

12. The method of claim 11 wherein curing the curable material comprises delivering curing energy from curing devices positioned adjacent the substrate such that the curing energy passes through the textured web before reaching the curable material.

13. The method of claim 5 wherein the first curable material is electrically non-conductive and the second hardenable material is electrically conductive.

14. The method of claim 13 wherein the substrate pre-forms have raised areas and recessed areas and the second hardenable material is a conductive coating that is applied to at least a portion of the pre-forms in a configuration that defines at least a portion of each electronic circuit.

15. The method of claim 14 further comprising applying a coating material, different from the conductive coating, to at least a portion of the pre-form.

16. The method of claim 15, wherein the coating material comprises an insulator, and is applied between the substrate pre-form and the conductive coating.

17. The method of claim 14, further comprising placing an electronic device in communication with the printed circuit.

18. The method of claim 14 wherein the substrate comprises a flat panel sheet and the circuit comprises an electrical array, and the method further comprises placing a layer of material in the shape of a grid on top of the conductive coating.

19. The method of claim 5 wherein the substrate is a continuous web of material.

20. The method of claim 5 wherein the substrate is a cellulosic substrate.

21. The method of claim 5 wherein the substrate is in the form of a metal plate.

22. A method of forming a transistor comprising:
(a) transferring a first curable material to a substrate using a pattern imparting medium to impart a pattern to the curable material;
(b) configuring the pattern imparting medium so that the first curable material forms a substrate pre-form on the substrate;
(c) tip printing a second layer on top of raised portions on the substrate;
(d) filling a recessed portion of the pre-forms with conductive material; and
(e) coating a third layer on the second layer, wherein the third layer covers portions of the second layer and the recessed portion.

23. A method of forming a conductive grid comprising:
(a) providing a first substrate having a layer of first curable material that forms a plurality of substrate pre-forms on the substrate, the substrate pre-forms comprising a pattern of raised areas and recessed areas in the form of parallel rows;
(b) forming a plurality of conductive lines on the first substrate by selectively transferring a conductive coating only to predetermined portions of the substrate pre-forms;
(c) providing a second substrate having a layer of first curable material that forms a plurality of substrate pre-forms on the substrate, the substrate pre-forms comprising a pattern of raised areas and recessed areas in the form of parallel rows;
(d) forming a plurality of conductive lines on the second substrate by selectively transferring a conductive coating only to predetermined portions of the substrate pre-forms; and
(e) positioning the second substrate on top of the first substrate, with the parallel rows on the second substrate disposed substantially perpendicular to the parallel rows on the first substrate.

* * * * *